US012327797B2

(12) United States Patent
Pietambaram et al.

(10) Patent No.: US 12,327,797 B2
(45) Date of Patent: Jun. 10, 2025

(54) MICROELECTRONIC STRUCTURES INCLUDING GLASS CORES

(71) Applicant: Intel Corporation, Santa Clara, CA (US)

(72) Inventors: Srinivas V. Pietambaram, Chandler, AZ (US); Tarek A. Ibrahim, Mesa, AZ (US); Gang Duan, Chandler, AZ (US); Sai Vadlamani, Chandler, AZ (US); Bharat Prasad Penmecha, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 913 days.

(21) Appl. No.: 17/124,352

(22) Filed: Dec. 16, 2020

(65) Prior Publication Data

US 2022/0189880 A1 Jun. 16, 2022

(51) Int. Cl.
*H01L 23/538* (2006.01)
*H01L 23/498* (2006.01)
*H01L 25/065* (2023.01)

(52) U.S. Cl.
CPC .... *H01L 23/5386* (2013.01); *H01L 23/49822* (2013.01); *H01L 23/49894* (2013.01); *H01L 23/5383* (2013.01); *H01L 25/0655* (2013.01)

(58) Field of Classification Search
CPC ........... H01L 23/5386; H01L 23/49822; H01L 23/49894; H01L 23/5383; H01L 25/0655;
(Continued)

(56) References Cited

U.S. PATENT DOCUMENTS 8,546,955 B1   10/2013  Wu
9,368,450 B1   6/2016   Gu et al.
(Continued)

FOREIGN PATENT DOCUMENTS

CN    104010448 B    4/2018
DE    102014003462 A1  9/2015
(Continued)

OTHER PUBLICATIONS

Search Report from European Patent Application No. 20162143.0, mailed Sep. 29, 2020, 7 pages.
(Continued)

*Primary Examiner* — Benjamin P Sandvik
*Assistant Examiner* — John Patrick Cornely
(74) *Attorney, Agent, or Firm* — Akona IP PC

(57) ABSTRACT

Disclosed herein are microelectronic structures including glass cores, as well as related assemblies and methods. In some embodiments, a microelectronic structure may include a glass core having through-glass vias (TGVs) therein; a metallization region at a first face of the glass core, wherein a conductive pathway in the first metallization region is conductively coupled to at least one of the TGVs; a bridge component in the metallization region; a first conductive contact at a face of the metallization region, wherein the first conductive contact is conductively coupled to the conductive pathway; and a second conductive contact at the face of the metallization region, wherein the second conductive contact is conductively coupled to the bridge component.

6 Claims, 12 Drawing Sheets

(58) Field of Classification Search
CPC ..... H01L 24/06; H01L 24/19; H01L 25/0652; H01L 25/50; H01L 23/15; H01L 23/49816; H01L 23/5384; H01L 24/16; H01L 24/17; H01L 24/32; H01L 24/73
See application file for complete search history.

(56) References Cited

U.S. PATENT DOCUMENTS

| | | |
|---|---|---|
| 10,163,798 B1 | 12/2018 | Alur et al. |
| 2010/0298027 A1 | 11/2010 | Yun |
| 2011/0116246 A1 | 5/2011 | Lee et al. |
| 2011/0304999 A1 | 12/2011 | Yu et al. |
| 2012/0049368 A1 | 3/2012 | Tanaka |
| 2012/0305303 A1 | 12/2012 | Hossain et al. |
| 2013/0084653 A1 | 4/2013 | Rubin et al. |
| 2013/0299982 A1 | 11/2013 | Pagaila et al. |
| 2014/0035131 A1 | 2/2014 | Noh et al. |
| 2014/0299999 A1 | 10/2014 | Hu et al. |
| 2015/0223318 A1 | 8/2015 | Sakamoto |
| 2015/0279817 A1 | 10/2015 | Zhang et al. |
| 2016/0071818 A1 | 3/2016 | Wang et al. |
| 2016/0079171 A1 | 3/2016 | Yeh et al. |
| 2016/0284637 A1 | 9/2016 | Ma et al. |
| 2016/0302308 A1 | 10/2016 | Lee et al. |
| 2016/0372432 A1 | 12/2016 | Tan |
| 2018/0102338 A1* | 4/2018 | McLellan ............... H05K 3/368 |
| 2018/0284186 A1 | 10/2018 | Chadha et al. |
| 2018/0350684 A1 | 12/2018 | Mandal et al. |
| 2019/0051633 A1 | 2/2019 | Bhagavat et al. |
| 2020/0058627 A1 | 2/2020 | Chen et al. |
| 2020/0118984 A1 | 4/2020 | Chen et al. |
| 2020/0273763 A1 | 8/2020 | Tsuchida et al. |
| 2020/0303309 A1 | 9/2020 | Sankman et al. |
| 2020/0312767 A1 | 10/2020 | Pietambaram et al. |
| 2020/0335443 A1 | 10/2020 | Zhou et al. |
| 2020/0395313 A1 | 12/2020 | Mallik et al. |
| 2021/0005542 A1 | 1/2021 | Mallik et al. |

FOREIGN PATENT DOCUMENTS

| | | |
|---|---|---|
| JP | 689660 | 3/2019 |
| WO | 2015079551 A1 | 6/2015 |
| WO | 2016179159 A1 | 11/2016 |
| WO | 2018063316 A1 | 4/2018 |
| WO | 2018125132 A1 | 7/2018 |
| WO | 2018182610 A1 | 10/2018 |
| WO | 2020005392 A1 | 1/2020 |

OTHER PUBLICATIONS

Search Report from European Patent Application No. 20163053.0, mailed Aug. 28, 2020, 9 pages.
U.S. Appl. No. 16/522,494, filed Jul. 25, 2019, 68 pages.
U.S. Appl. No. 16/832,851, filed Mar. 27, 2020, 48 pages.
International Search Report and Written Opinion in International Patent Application PCT/US2021051692 dated Jan. 10, 2022, 13 pages.
Final Office Action in U.S. Appl. No. 16/363,698 dated Dec. 4, 2020, 26 pages.
Non Final Office Action in U.S. Appl. No. 16/363,698 dated Jul. 21, 2020, 25 pages.
Search Report from European Patent Application No. 20156743.5, mailed Jul. 30, 2020, 6 pages.

* cited by examiner

MICROELECTRONIC STRUCTURES INCLUDING GLASS CORES

BACKGROUND

In conventional microelectronic packages, a die may be attached to an organic package substrate by solder. Such a package may be limited in the achievable interconnect density between the package substrate and the die, the achievable speed of signal transfer, and the achievable miniaturization, for example.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
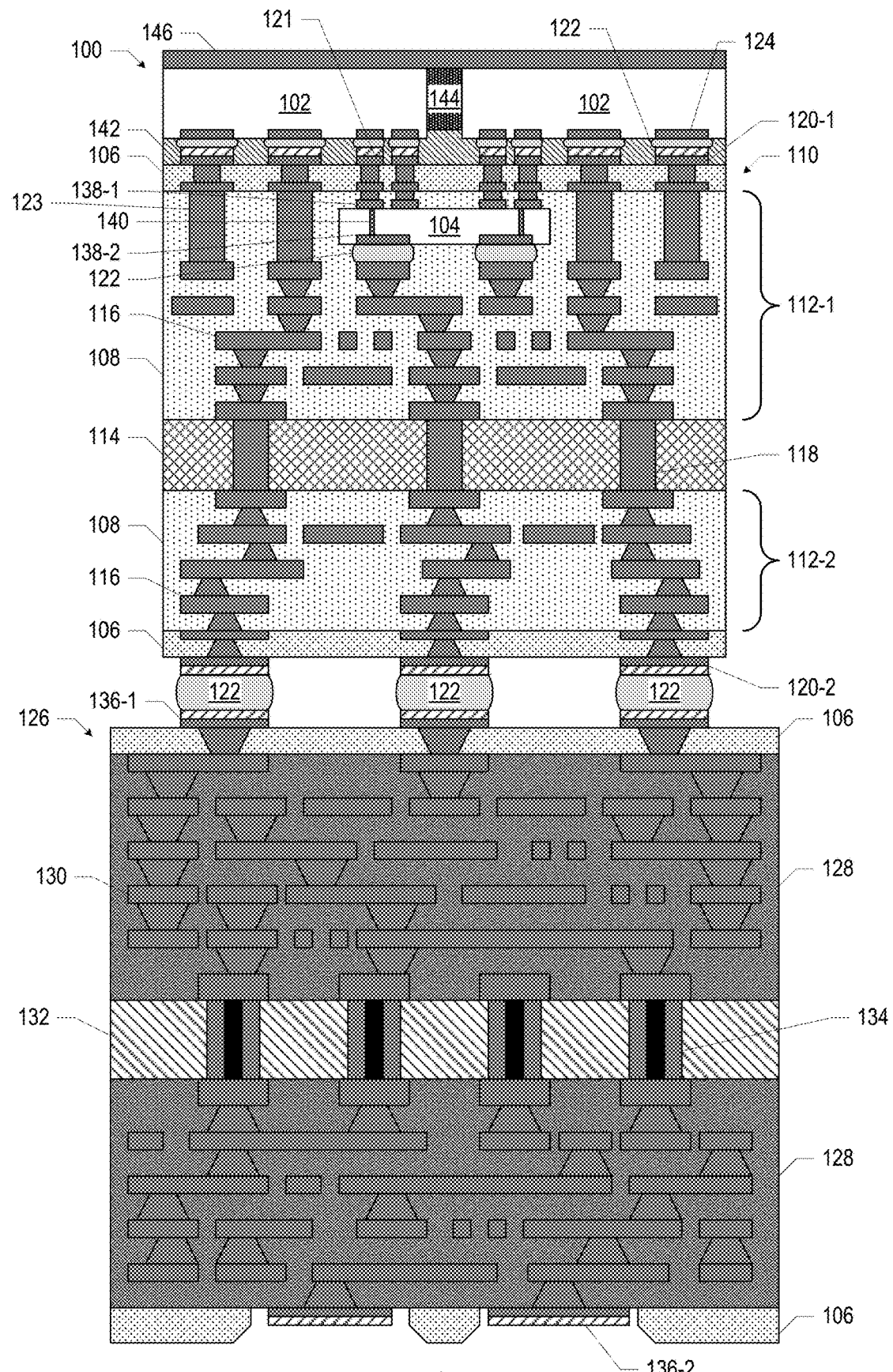
FIG. 1 is a side, cross-sectional view of an example microelectronic assembly including a microelectronic structure having a glass core, in accordance with various embodiments.

Disclosed herein are microelectronic structures including glass cores, as well as related assemblies and methods. In some embodiments, a microelectronic structure may include a glass core having through-glass vias (TGVs) therein; a metallization region at a first face of the glass core, wherein a conductive pathway in the first metallization region is conductively coupled to at least one of the TGVs; a bridge component in the metallization region; a first conductive contact at a face of the metallization region, wherein the first conductive contact is conductively coupled to the conductive pathway; and a second conductive contact at the face, wherein the second conductive contact is conductively coupled to the bridge component.

Die partitioning, in which multiple smaller dies are coupled together by high-density interconnects, may achieve smaller form factors and higher yields than utilizing a single, monolithic die. However, coupling dies together at the fine pitch needed to achieve desired interconnect density has been limited by conventional approaches. For example, the warpage of substrate surfaces that may occur during fabrication can make it difficult to reliably couple dies to a common underlying substrate.

The structures and assemblies disclosed herein may include a glass core with filled TGVs for front-to-back connections between two different metallization regions (e.g., redistribution layer regions). The metallization regions may provide routing for design flexibility, and the glass core may provide dimensional stability, allowing the structures and assemblies disclosed herein to exhibit little to no warpage. Further, a fine-pitch bridge element in one metallization region of a microelectronic structure may be used to provide high-density interconnects between dies, while the other metallization region of the microelectronic structure may be used to fanout to larger pitches for robust attachment to a package substrate.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The phrase "A or B" means (A), (B), or (A and B). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y.

FIG. 1 is a side, cross-sectional view of an example microelectronic assembly 100 including multiple dies 102, a microelectronic structure 110, and a package substrate 126. The microelectronic structure 110 may include a glass core 114 having multiple TGVs 118 therein, and metallization regions 112 at opposing faces of the glass core 114. In particular, a metallization region 112-1 may be between the glass core 114 and the dies 102, and a metallization region 112-2 may be between the glass core 114 and the package substrate 126. The metallization region 112-1 may also include a bridge component 104, with one or more layers of the metallization region 112-1 between the glass core 114 and the bridge component 104, and one or more layers of the metallization region 112-1 between the bridge component 104 and the dies 102. The TGVs 118 may be filled with one or more conductive materials (e.g., one or more metals, such as copper). In some embodiments, the glass core 114 may have a coefficient of thermal expansion (CTE) that is less than 6 per degree Celsius (e.g., less than 3.5 per degree Celsius, or less than 3.4 per degree Celsius); such a CTE may result in the microelectronic structure 110 with an acceptable amount of thermal warpage, enabling the dies 102 and the package substrate 126 to be reliably attached to the microelectronic structure 110.

The metallization regions 112 may include a dielectric material 108 and conductive material 116, with the conductive material 116 arranged in the dielectric material 108 (e.g., in lines and vias, as shown) to provide conductive pathways through the metallization regions 112. In some embodiments, the dielectric material 108 may include an organic material, such as an organic buildup film. In some embodiments, the dielectric material 108 may include a ceramic, an epoxy film having filler particles therein, glass, an inorganic material, or combinations of organic and inorganic materials, for example. In some embodiments, the conductive material 116 may include a metal (e.g., copper). In some embodiments, the metallization regions 112 may include layers of dielectric material 108/conductive material 116, with lines of conductive material 116 in one layer electrically coupled to lines of conductive material 116 in an adjacent layer by vias of the conductive material 116. One or more conductive pathways in the metallization region 112-1 may be coupled to one or more of the TGVs 118, and one or more conductive pathways in the metallization region 112-2 may be coupled to one or more of the TGVs 118. One or more conductive pathways in the metallization region 112-1 may be coupled to conductive contacts 120-1 at the "top" face of the microelectronic structure 110, and one or more conductive pathways in the metallization region 112-2 may be coupled to conductive contacts 120-2 at the "bottom" face of the microelectronic structure 110. Further, one or more conductive pathways in the metallization region 112-1 may be coupled to the bridge component 104 (e.g., the "top" face of the microelectronic structure 110 may also include conductive contacts 121, which are coupled to conductive contacts 138-1 of the bridge component 104, as discussed further below). Consequently, the microelectronic structure 110 may include any desired arrangement of conductive pathways between the conductive contacts 120-1, the conductive contacts 120-2, the conductive contacts 121, and the bridge component 104, allowing components electrically coupled to the conductive contacts 120/121 (e.g., the dies 102 and/or the package substrate 126) to communicate with circuitry within the die 102 (e.g., the bridge component 104) and/or to other components electrically coupled to the microelectronic structure 110. In some embodiments, the metallization layers of the metallization regions 112 of the microelectronic structure 110 may be redistribution layers, and the metallization regions 112 may be formed using a redistribution layer technique (e.g., a semi-additive processing (SAP) technique). As shown in FIG. 1, in some embodiments, the bridge component 104 may be coplanar with pillars 123 of the conductive material 116; the pillars 123 may be taller than the thickness of the bridge component 104, as shown. Although a particular number and arrangement of layers of dielectric material 108/conductive material 116 are shown in various ones of the accompanying figures, these particular numbers and arrangements are simply illustrative, and any desired number and arrangement of dielectric material 108/conductive material 116 may be used. In some embodiments, a microelectronic structure 110 may include ten or fewer metallization layers in the metallization region 112-1, and ten or fewer metallization layers in the metallization region 112-2. In some embodiments, a microelectronic structure 110 may include four or fewer metallization layers in the metallization region 112-1, and four or fewer metallization layers in the metallization region 112-2. In some embodiments, the metallization region 112-1 may have the same number of metallization layers as the metallization region 112-2, while in other embodiments, the metallization region 112-1 and the metallization region 112-2 may have different numbers of metallization layers. As shown in FIG. 1, in some embodiments, the vias of the metallization regions 112 may have a tapered shape, narrowing towards the glass core 114. In some embodiments, the pitch of the "bottom" conductive contacts 120-2 may be greater than the pitch of the "top" conductive contacts 120-1.

The microelectronic structure 110 may include a surface insulation material 106 at its top and bottom faces, around the proximate conductive contacts 120/121. The surface insulation material 106 may include a solder resist and/or other dielectric materials that may provide surface electrical insulation and may be compatible with solder-based or non-solder-based interconnects, as appropriate. The conductive contacts 120/121 may include a surface finish (not labeled, but illustrated on the conductive contacts 120/121), which may protect the underlying material of the conductive contact from corrosion and help ensure reliable solder joint formation. In some embodiments, the surface finish may include nickel, palladium, gold, or a combination thereof. In FIG. 1, solder 122 may be in conductive contact with the conductive contacts 120/121, and may be used to couple the microelectronic structure 110 to the dies 102 and/or to the package substrate 126. As shown in FIG. 1, the openings in the surface insulation material 106 proximate to the "bottom" conductive contacts 120-2 may be tapered, narrowing towards the glass core 114. As used herein, a "conductive contact" may refer to a portion of conductive material (e.g., one or more metals) serving as part of an interface between different components; although some of the conductive contacts discussed herein are illustrated in a particular manner in various ones of the accompanying drawings, any conductive contacts may be recessed in, flush with, or extending away from a surface of a component, and may take any suitable form (e.g., a conductive pad or socket).

As noted above, a bridge component 104 may be embedded in the metallization region 112-1, and may be electrically coupled to the metallization region 112-1. This coupling may include electrical interconnects above and below the bridge component 104, as shown in FIG. 1, or may include electrical interconnects only above the bridge component 104 (e.g., as discussed below with reference to FIG. 17). The bridge component 104 may include conductive contacts 138-1 at its "top" face and conductive contacts 138-2 at its "bottom" face; the conductive contacts 138-1 may be coupled to conductive contacts 124 of one or more dies 102 via intervening conductive contacts 121, and the conductive contacts 138-2 may be coupled to conductive material 116 of the metallization region 112-1 via solder 122 (and thus to any desired conductive pathway in the microelectronic structure 110). The bridge component 104 may include conductive pathways (e.g., including lines and vias, as discussed below with reference to FIG. 20) to the conductive contacts 138 (and/or to other circuitry included in the bridge component 104). In some embodiments, the bridge component 104 may include a semiconductor material (e.g., silicon); for example, the bridge component 104 may be a die 1502, as discussed below with reference to FIG. 19, and may include an integrated circuit (IC) device 1600, as discussed below with reference to FIG. 20. In some embodiments, the bridge component 104 may be an "active" component in that it may contain one or more active devices (e.g., transistors), while in other embodiments, the bridge component 104 may be a "passive" component in that it does not contain one or more active devices. The bridge component 104 may include one or more through-substrate vias (TSVs, such as through-silicon vias) 140, providing electrical pathways between the conductive contacts 138-1 and the conductive contacts 138-2. The bridge component 104 may be manufactured so as to permit a greater density of interconnects than the metallization regions 112. Consequently, the pitch of the conductive contacts 121 (which may be the same as the pitch of the conductive contacts 138-1 of the bridge component 104) may be less than the pitch of the conductive contacts 120-1. In some embodiments, the pitch of the conductive contacts 121 may be less than 36 microns. When multiple dies 102 are coupled to the bridge component 104, as shown, these dies 102 may use the electrical pathways through the bridge component 104 (and may use other circuitry within the bridge component 104, when present) to achieve a higher density interconnection between them, relative to interconnections made via the conductive contacts 120 of the microelectronic structure 110.

The dimensions of the elements of a microelectronic structure 110 may take any suitable values. For example, in some embodiments, the thickness of the metal lines of the conductive contacts 120/121 may be between 5 microns and 25 microns. In some embodiments, the thickness of the surface finish may be between 5 microns and 10 microns (e.g., 7 microns of nickel and less than 100 nanometers of each of palladium and gold). In some embodiments, the pitch of the conductive contacts 121 (which may be equal to the pitch of the conductive contacts 138-1 of the bridge component 104) may be less than 70 microns (e.g., between 25 microns and 70 microns, between 25 microns and 65 microns, between 40 microns and 70 microns, less than 36 microns, or less than 25 microns). In some embodiments, the pitch of the conductive contacts 120 may be greater than 70 microns (e.g., between 90 microns and 150 microns). In some embodiments, the thickness of the surface insulation material 106 may be between 25 microns and 50 microns. In some embodiments, the height of the solder 122 above the surface insulation material 106 may be between 25 microns and 50 microns. In some embodiments, the thickness of the bridge component 104 may be between 30 microns and 200 microns. In some embodiments, a microelectronic structure 110 may have a footprint that is less than 2500 square millimeters (e.g., between 100 square millimeters and 2000 square millimeters). In some embodiments, the thickness of the glass core 114 may be between 350 microns and 500 microns. In some embodiments, the pitch of the TGVs 118 may be between 75 microns and 200 microns (e.g., between 75 microns and 150 microns). In some embodiments, the diameters of the TGVs 118 may be between 35 microns and 100 microns (e.g., between 35 microns and 75 microns). In some embodiments, a thickness of a metallization region 112 of a microelectronic structure 110 may be between 30 microns and 200 microns (e.g., between 100 microns and 200 microns). In some embodiments, a thickness of the microelectronic structure 110 may be between 600 microns and 1000 microns.

As noted above, a microelectronic assembly 100 may include one or more dies 102 having conductive contacts 124 coupled to the conductive contacts 120 and the conductive contacts 121 of the bridge component 104 (e.g., by solder 122 or another interconnect structure). FIG. 1 illustrates two dies 102, but a microelectronic assembly 100 may include more or fewer dies 102. Although FIG. 1 depicts the dies 102 as substantially "covering" the proximate surface of the microelectronic structure 110, this is simply an illustration, and need not be the case. Further, although FIG. 1 depicts microelectronic structures 110/microelectronic assemblies 100 that include a single bridge component 104 in a microelectronic structure 110, this is simply for ease of illustration, and a microelectronic structure 110/microelectronic assembly 100 may include multiple bridge components 104 in a microelectronic structure 110.

The dies 102 may include conductive pathways (e.g., including lines and vias, as discussed below with reference to FIG. 20) to the conductive contacts 124 (and/or to other circuitry included in the die 102 and/or to other conductive contacts of the die 102, not shown). In some embodiments, a die 102 may include a semiconductor material (e.g., silicon); for example, a die 102 may be a die 1502, as discussed below with reference to FIG. 19, and may include an IC device 1600, as discussed below with reference to FIG. 20. In some embodiments, a die 102 may be an "active" component in that it may contain one or more active devices (e.g., transistors), while in other embodiments, the die 102 may be a "passive" component in that it does not contain one or more active devices. In some embodiments, for example, a die 102 may be a logic die. In some embodiments, for example, a die 102 may be an interposer. More generally, the die 102 may include circuitry to perform any desired functionality and/or routing. For example, one or more of the dies 102 may be logic dies (e.g., silicon-based dies), and one or more of the dies 102 may be memory dies (e.g., high bandwidth memory). As discussed above, when multiple dies 102 are coupled to the microelectronic structure 110, these dies 102 may use the electrical pathways through the bridge component 104 (and may use other circuitry within the bridge component 104, when present) to achieve a higher density interconnection between them, relative to interconnections made solely via the dielectric material 108/conductive material 116 of the metallization region 104-1.

In some embodiments, a mold material 144 may be disposed between the dies 102. In some embodiments, an underfill material 142 may be disposed between the dies 102 and the microelectronic structure 110. Example materials that may be used for the mold material 144 and the underfill material 142 include epoxy materials, as suitable. In some embodiments, backside metallization 146 may be present on the "top" faces of the dies 102, as shown in FIG. 1.

The conductive contacts 120-2 at the "bottom" face of the microelectronic structure 110 may be coupled via solder to conductive contacts 136-1 at the "top" face of a package substrate 126. The package substrate 126 may also include conductive contacts 136-2 at its "bottom" face. The particular package substrate 126 illustrated in FIG. 1 may include a core 132 with through-core vias 134 therein, but in other embodiments, the package substrate 126 may be a coreless substrate (e.g., as discussed below with reference to FIG. 18). At either face of the core 132, the package substrate 126 may include metallization regions having a dielectric material 128 and conductive material 130, with the conductive material 130 arranged in the dielectric material 128 (e.g., in lines and vias, as shown) to provide conductive pathways through the package substrate 126. In some embodiments, the dielectric material 128 may include an organic material, such as an organic buildup film, or any other suitable dielectric material. In some embodiments, the conductive material 130 may include a metal (e.g., copper). In some embodiments, the package substrate 126 may include layers of dielectric material 128/conductive material 130, with lines of conductive material 130 in one layer electrically coupled to lines of conductive material 130 in an adjacent layer by vias of the conductive material 130. A package substrate 126 including such layers may be formed using a redistribution layer technique (e.g., a semi-additive processing (SAP) technique) or a printed circuit board (PCB) fabrication technique as appropriate, for example. Although a particular number and arrangement of layers of dielectric material 128/conductive material 130 are shown in various ones of the accompanying figures, these particular numbers and arrangements are simply illustrative, and any desired number and arrangement of dielectric material 128/conductive material 130 may be used. Surface insulation material 106 may be present at the "top" and "bottom" faces of the package substrate 126, proximate to the conductive contacts 136, and the conductive contacts 136 may include a surface finish, as discussed above. In some embodiments, the conductive contacts 136-2 may be contacts for solder (e.g., of a ball grid array arrangement), while in other embodiments, non-solder interconnects (e.g., a pin grid array arrangement or a land grid array arrangement) may be used to electrically couple the conductive contacts 136-2 to another component. The conductive contacts 136-2 may be used to couple the package substrate 126 to another component, such as a circuit board (e.g., a motherboard), an interposer, or another IC package, as known in the art and as discussed below with reference to FIG. 21. In embodiments in which the microelectronic assembly 100 includes multiple dies 102, the microelectronic assembly 100 may be referred to as a multi-chip package (MCP). A microelectronic assembly 100 may include additional components, such as passive components (e.g., surface-mount resistors, capacitors, and inductors disposed at the "top" face or the "bottom" face of the package substrate 126), active components, or other components.

FIGS. 2-16 are side, cross-sectional views of various stages in an example process for the manufacture of the microelectronic assembly 100 of FIG. 1, in accordance with various embodiments. Although the operations of the process of FIGS. 2-16 may be illustrated with reference to particular embodiments of the microelectronic structures 110/microelectronic assemblies 100 disclosed herein, the method may be used to form any suitable microelectronic structures 110/microelectronic assemblies 100. Operations are illustrated once each and in a particular order in FIGS. 2-16, but the operations may be reordered and/or repeated as desired (e.g., with different operations performed in parallel when manufacturing multiple microelectronic structures 110/microelectronic assemblies 100).

Figure 2:
FIGS. 2-16 are side, cross-sectional views of various stages in an example process for the manufacture of the microelectronic assembly of FIG. 1, in accordance with various embodiments.

FIG. 2 illustrates an assembly that includes a glass core 114. Although only a single "unit" of the glass core 114 is depicted in FIG. 2, this is simply for ease of illustration, and the glass core 114 of FIG. 1 may represent a panel of glass (from which multiple glass cores 114 will be singulated, as discussed further below).

Figure 3:
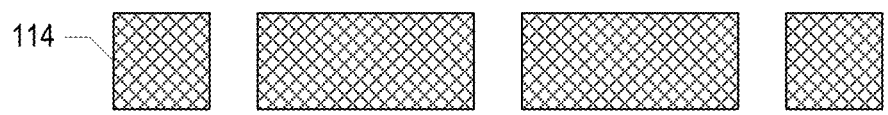

FIG. 3 illustrates an assembly subsequent to drilling holes in the glass core 114 of the assembly of FIG. 2. In some embodiments, a crack-free laser-based drilling process may be used to drill the holes at a desired pitch and diameter.

Figure 4:
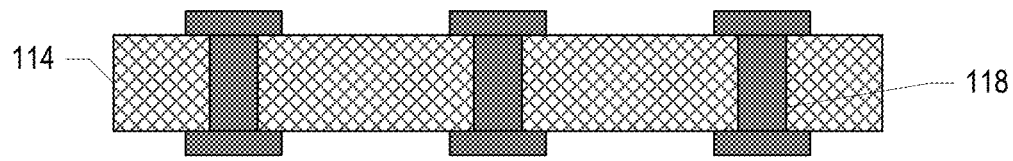

FIG. 4 illustrates an assembly subsequent to plating conductive material in the holes of the glass core 114 of the assembly of FIG. 3, forming the TGVs 118, and then forming conductive pads at either end of the individual TGVs 118. In some embodiments, the TGVs 118 may be formed by electroplating copper into the holes in the glass core 114, and extra copper on the glass surface may then be polished off. In some embodiments, a lithography process may be used to create the conductive pads on the TGVs 118, and these conductive pads may be used for subsequent metallization operations. In some embodiments, the conductive pads may not be formed directly on the glass surface; instead, after plating conductive material in the holes of the glass core 114 and polishing off the excess, a dielectric material may be provided on the glass surfaces (e.g., by lamination), vias may be formed in this dielectric to contact the TGVs 118, and conductive pads may be formed on this dielectric material. Any of the embodiments disclosed herein may include such an arrangement.

Figure 5:
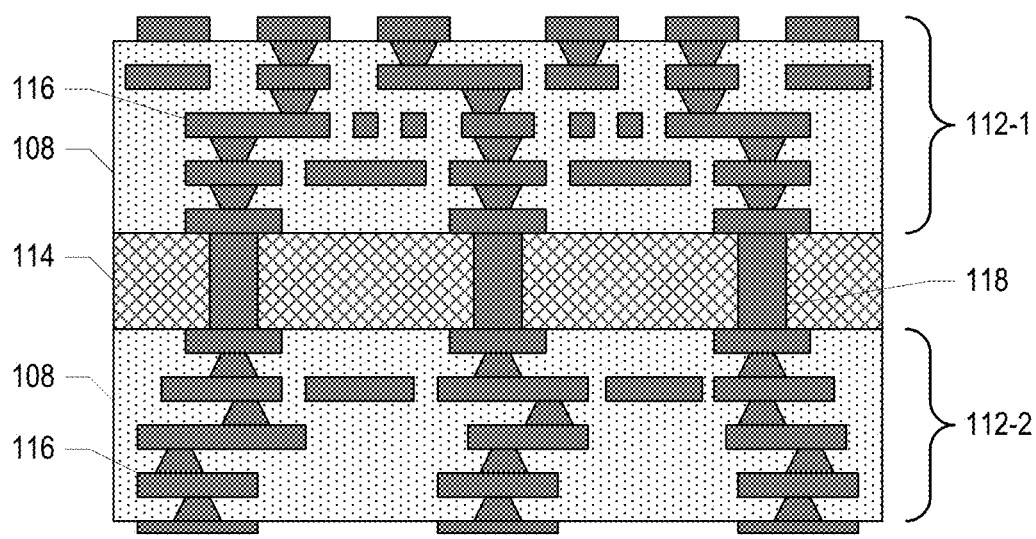

FIG. 5 illustrates an assembly subsequent to forming the bulk of the metallization regions 112 at either face of the glass core 114 of the assembly of FIG. 4. In some embodiments, a two-sided redistribution layer process (including SAP operations) may be performed to form the metallization regions 112. The dimensional stability of the glass core 114 may ensure good co-planarity of individual metallization layers in the metallization regions 112, and thus may achieve good layer-to-layer alignment.

Figure 6:
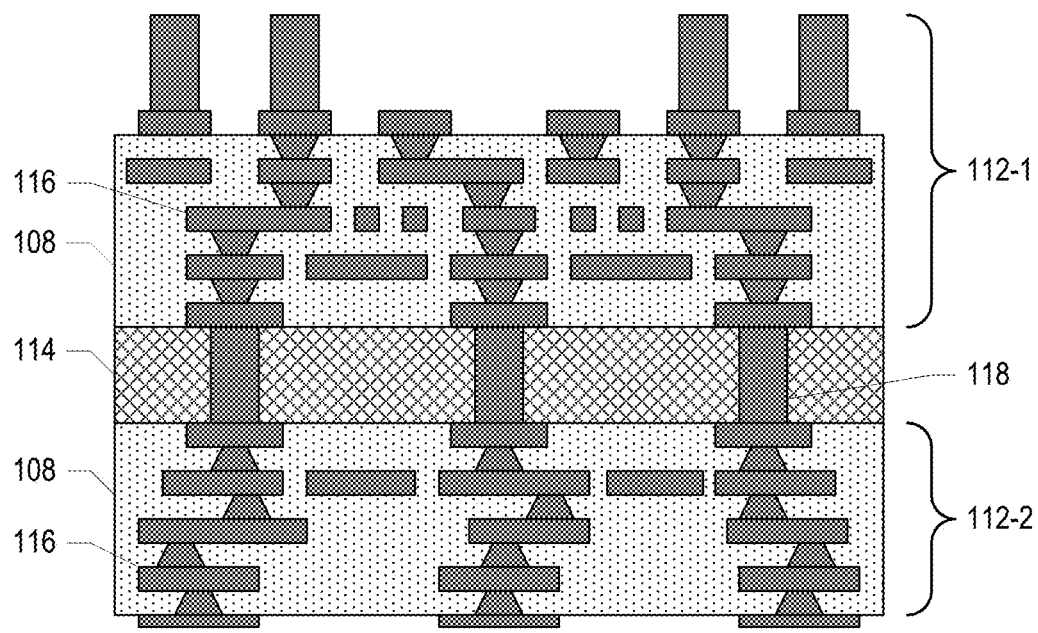

FIG. 6 illustrates an assembly subsequent to forming pillars 123 on the assembly of FIG. 5. The pillars 123 may be formed in the area around the desired location of the bridge component 104 (not shown), and their height may be greater than the intended thickness of the bridge component 104. In some embodiments, the pillars 123 may include copper.

Figure 7:
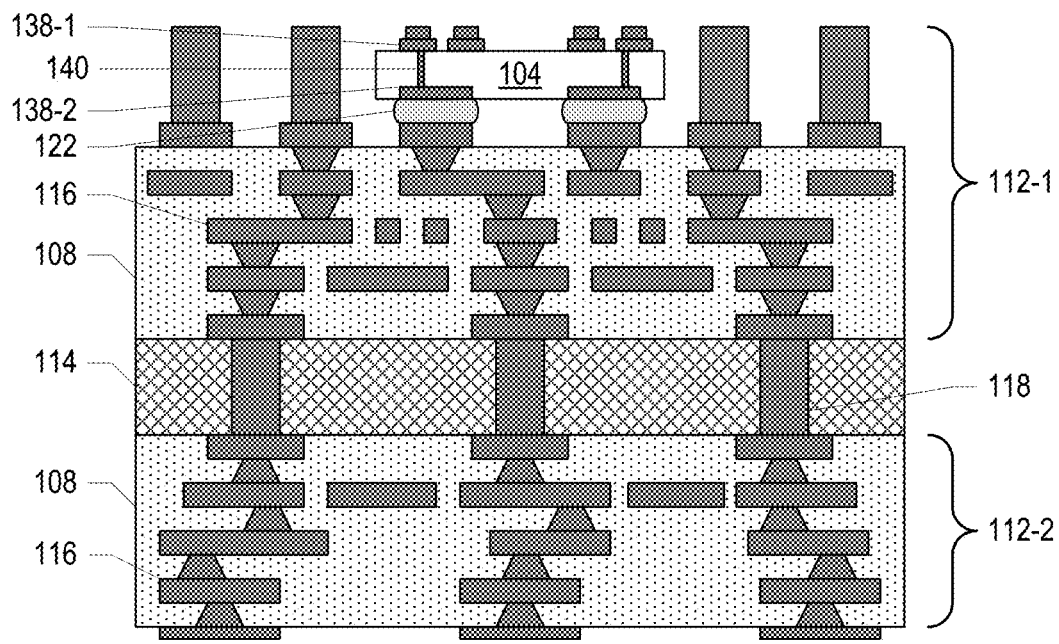

FIG. 7 illustrates an assembly subsequent to the bonding a bridge component 104 to exposed conductive pads of the assembly of FIG. 6 by solder 122. The bridge component 104 may include short conductive pillars thereon, conductively coupled to the conductive contacts 138-1 at the "top" face of the bridge component 104.

Figure 8:
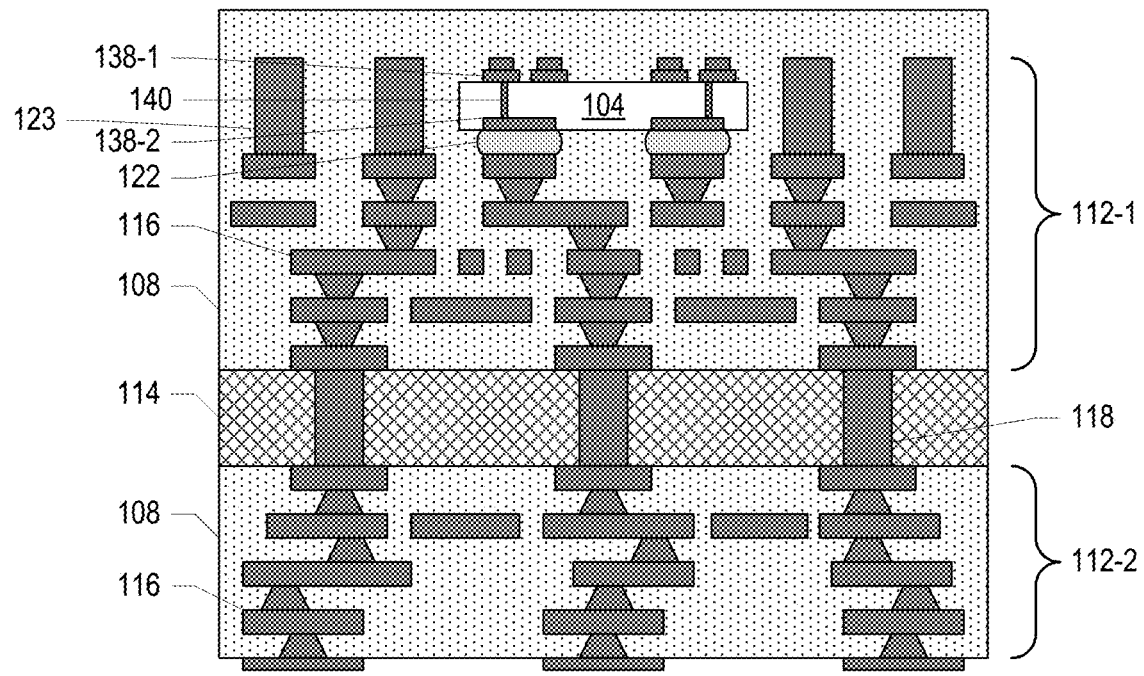

FIG. 8 illustrates an assembly subsequent to encapsulating the pillars 123 and the bridge component 104 of the assembly of FIG. 7 by the dielectric material 108. In some embodiments, the encapsulation may include lamination of additional dielectric material 108.

Figure 9:
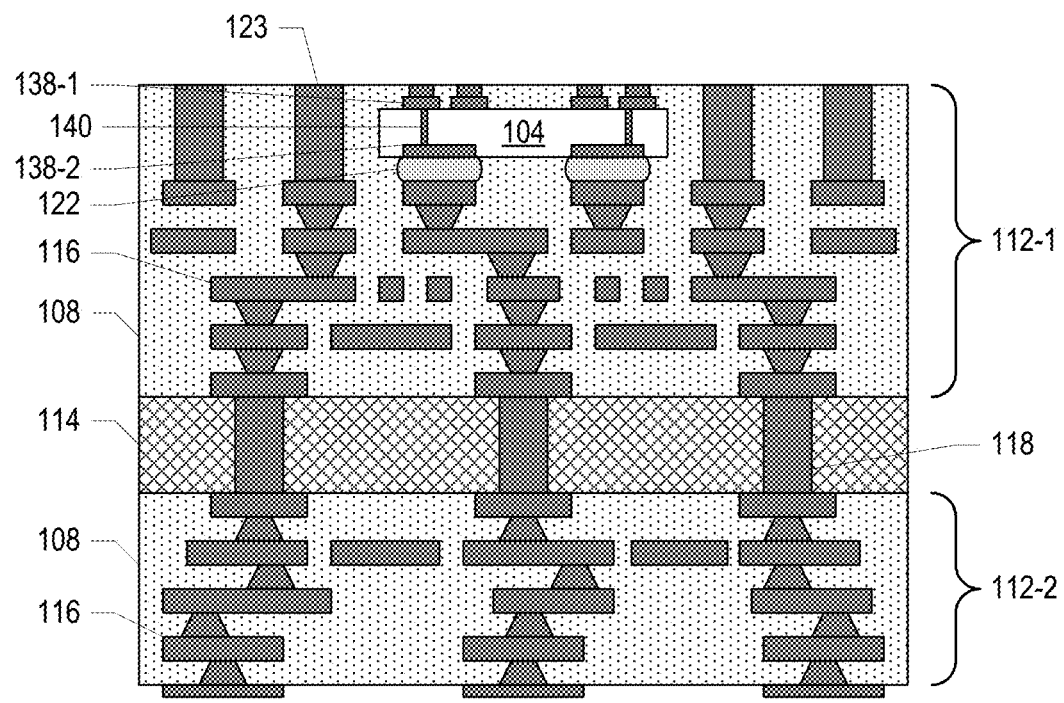

FIG. 9 illustrates an assembly subsequent to removing the dielectric material 108 at the "top" surface of the assembly of FIG. 8 to planarize and expose the pillars 123 and the conductive pillars above the bridge component 104. In some embodiments, these operations may include polishing or grinding.

Figure 10:
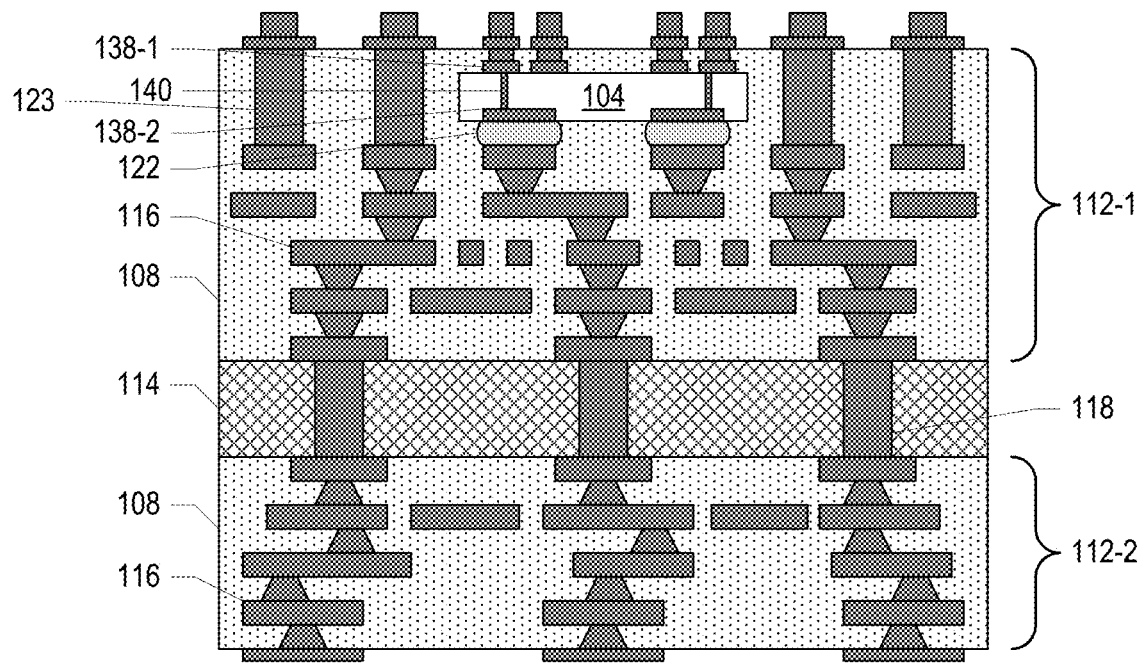

FIG. 10 illustrates an assembly subsequent to forming an additional metallization layer on the "top" surface of the assembly of FIG. 9. The additional metallization may include additional conductive pillars in conductive contact with the conductive pillars exposed at the "top" surface of the assembly of FIG. 9.

Figure 11:
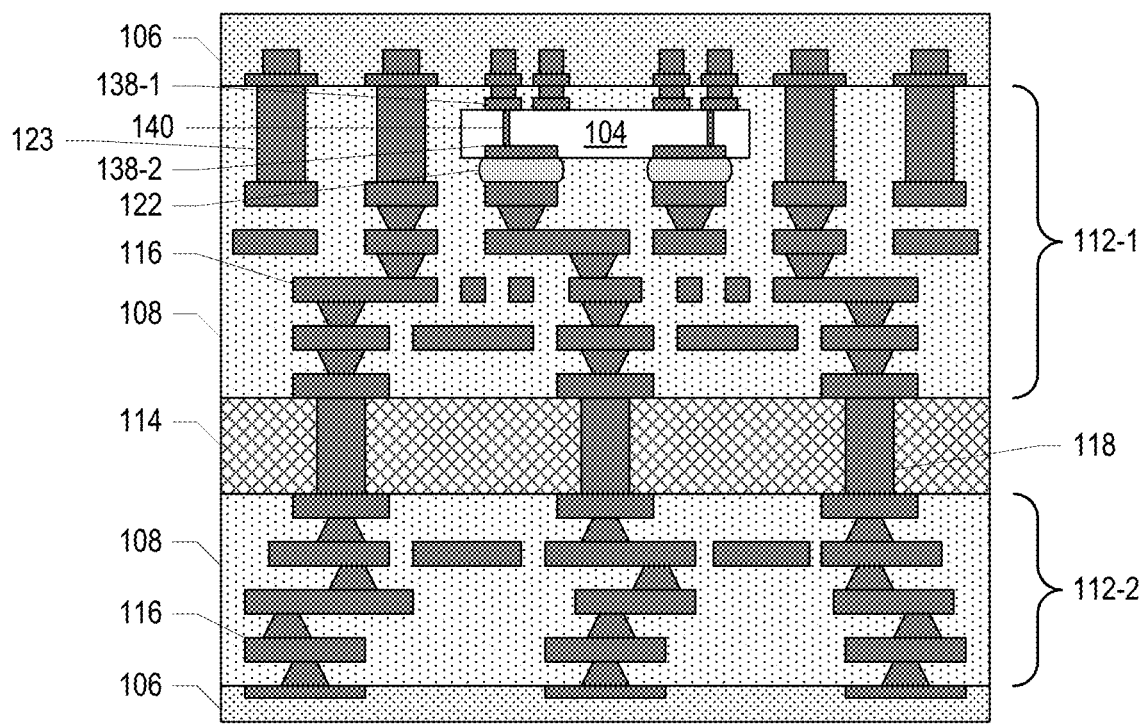

FIG. 11 illustrates an assembly subsequent to providing surface insulation material 106 at the "top" and "bottom" surfaces of the assembly of FIG. 10. In some embodiments, providing the surface insulation material 106 may include a two-sided solder resist lamination process.

Figure 12:
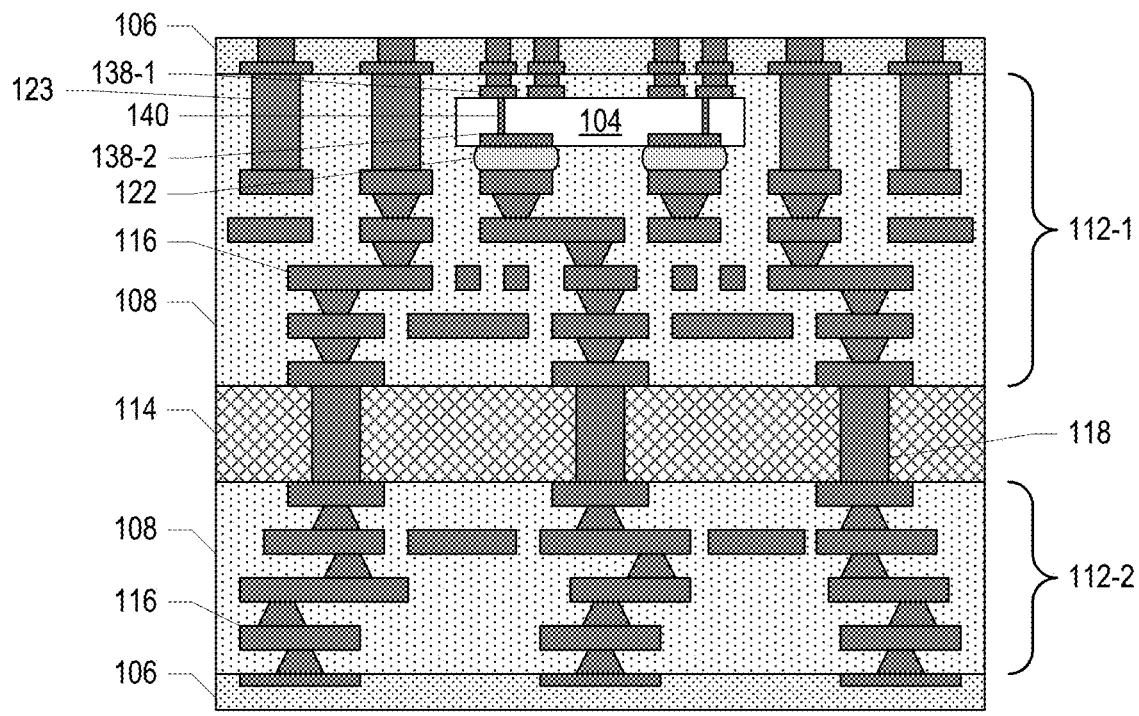

FIG. 12 illustrates an assembly subsequent to removing the surface insulation material 106 at the "top" surface of the assembly of FIG. 11 to expose the conductive pillars in the surface insulation material 106.

Figure 13:
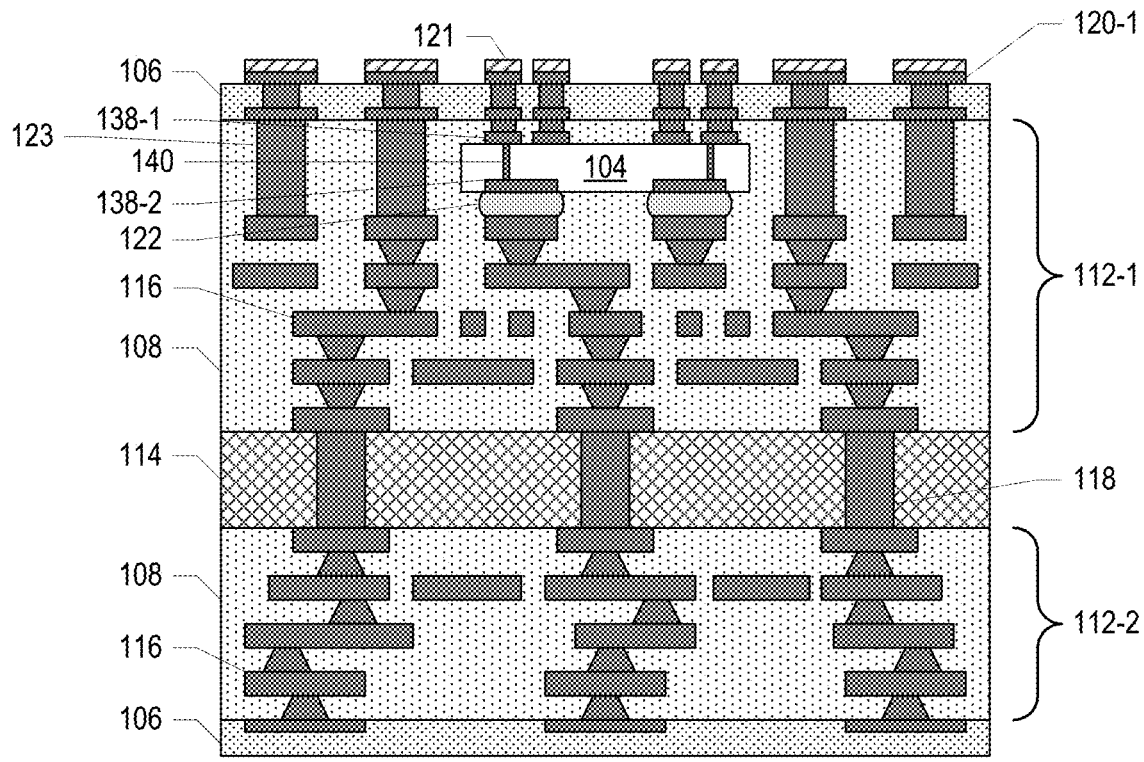

FIG. 13 illustrates an assembly subsequent to forming the conductive contacts 120-1 and 121 at the "top" surface of the assembly of FIG. 12. In some embodiments, the conductive contacts 120-1 and 121 may include plated tin.

Figure 14:
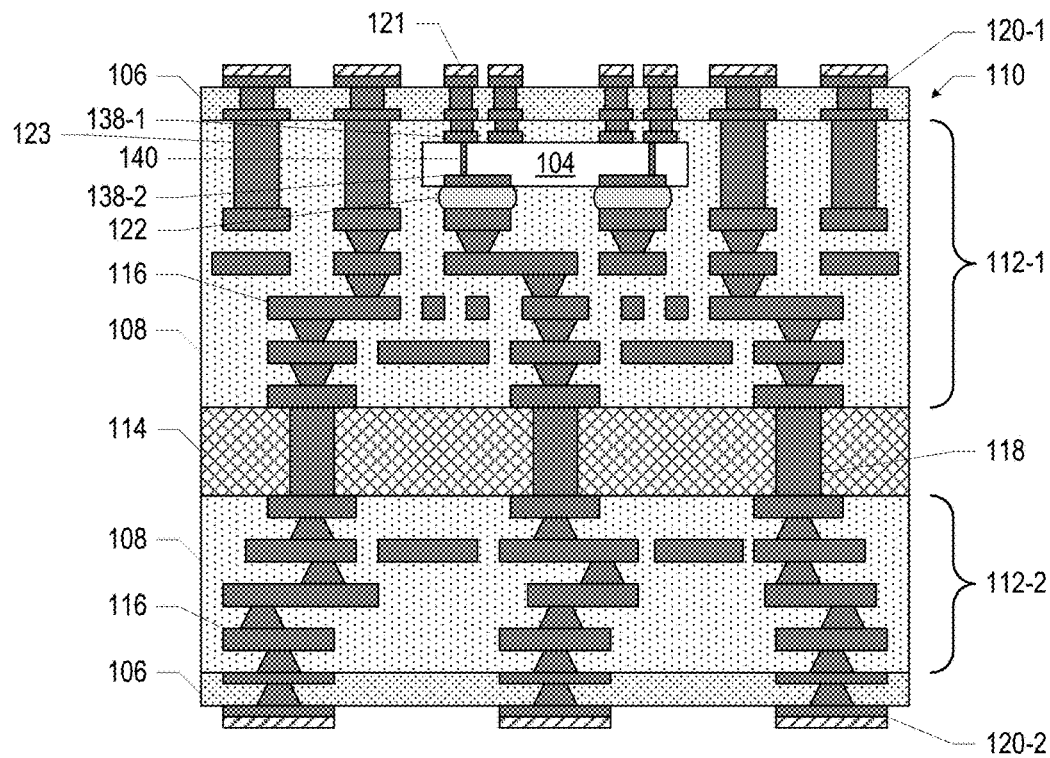

FIG. 14 illustrates an assembly subsequent to removing some of the surface insulation material 106 at the "bottom" surface of the assembly of FIG. 13 and providing additional material to form the conductive contacts 120-2. In some embodiments, this additional material includes copper and tin. At this stage, when the preceding operations have been performed on a panel of material, the panel may be singulated into multiple units prior to performing subsequent processing operations. In some alternate embodiments, the operations of FIGS. 10-14 may be replaced by a process in which conductive pads are formed on the revealed pillars 123 of the assembly of FIG. 9 (e.g., using photolithography), a solder resist material may be laminated thereon, lithographic techniques may be used to form large vias proximate to the conductive contacts 120-1 and ultraviolet laser techniques may be used to form smaller vias proximate to the conductive contacts 121, a surface finish (e.g., including nickel, palladium, and gold) may be formed thereon, and then a conductive material (e.g., tin) may be plated to form the conductive contacts 120-1 and the conductive contacts 121. In such a variant, the vias may have a tapered shape, narrowing towards the glass core 114.

Figure 15:
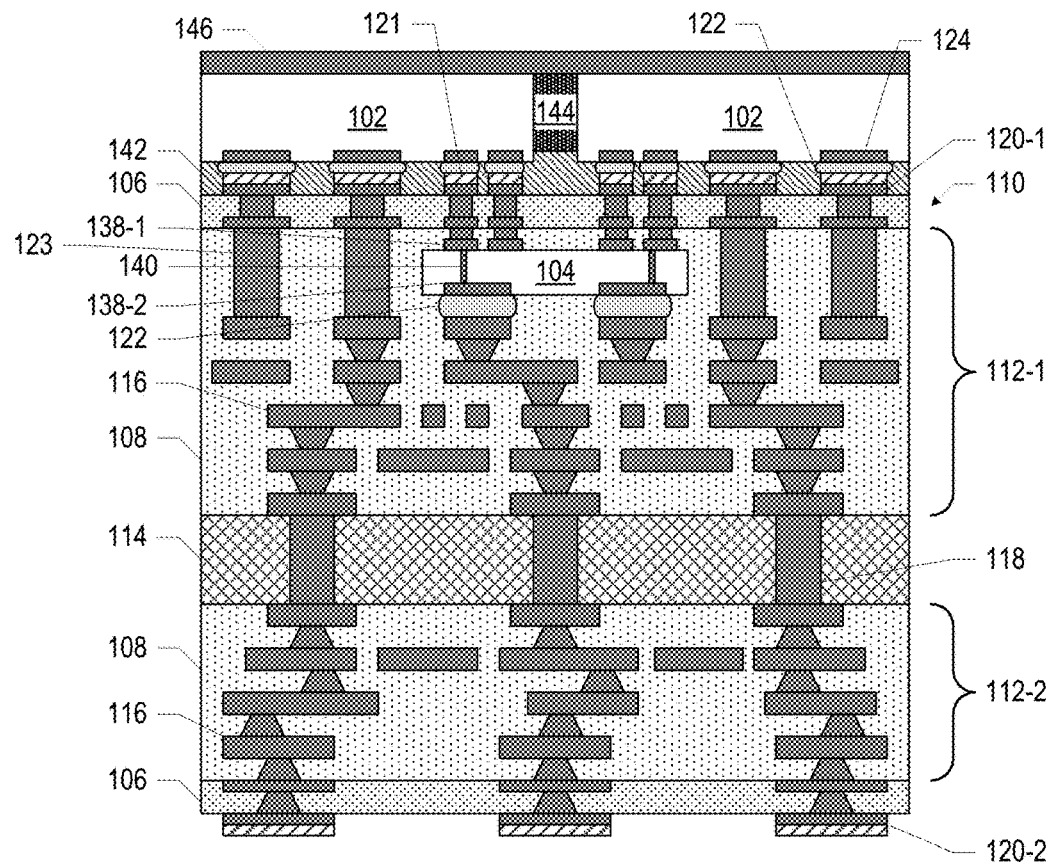

FIG. 15 illustrates an assembly subsequent to attaching the dies 102 to the conductive contacts 120-1 and 121 at the "top" surface of the assembly of FIG. 14 (e.g., using solder 122 as part of a thermocompression bonding (TCB) operation, providing the underfill material 142 between the dies 102 and the microelectronic structure 110, overmolding the dies 102 with the mold material 144, grinding away the overburden of mold material 144, and then providing any desired backside metallization 146.

Figure 16:
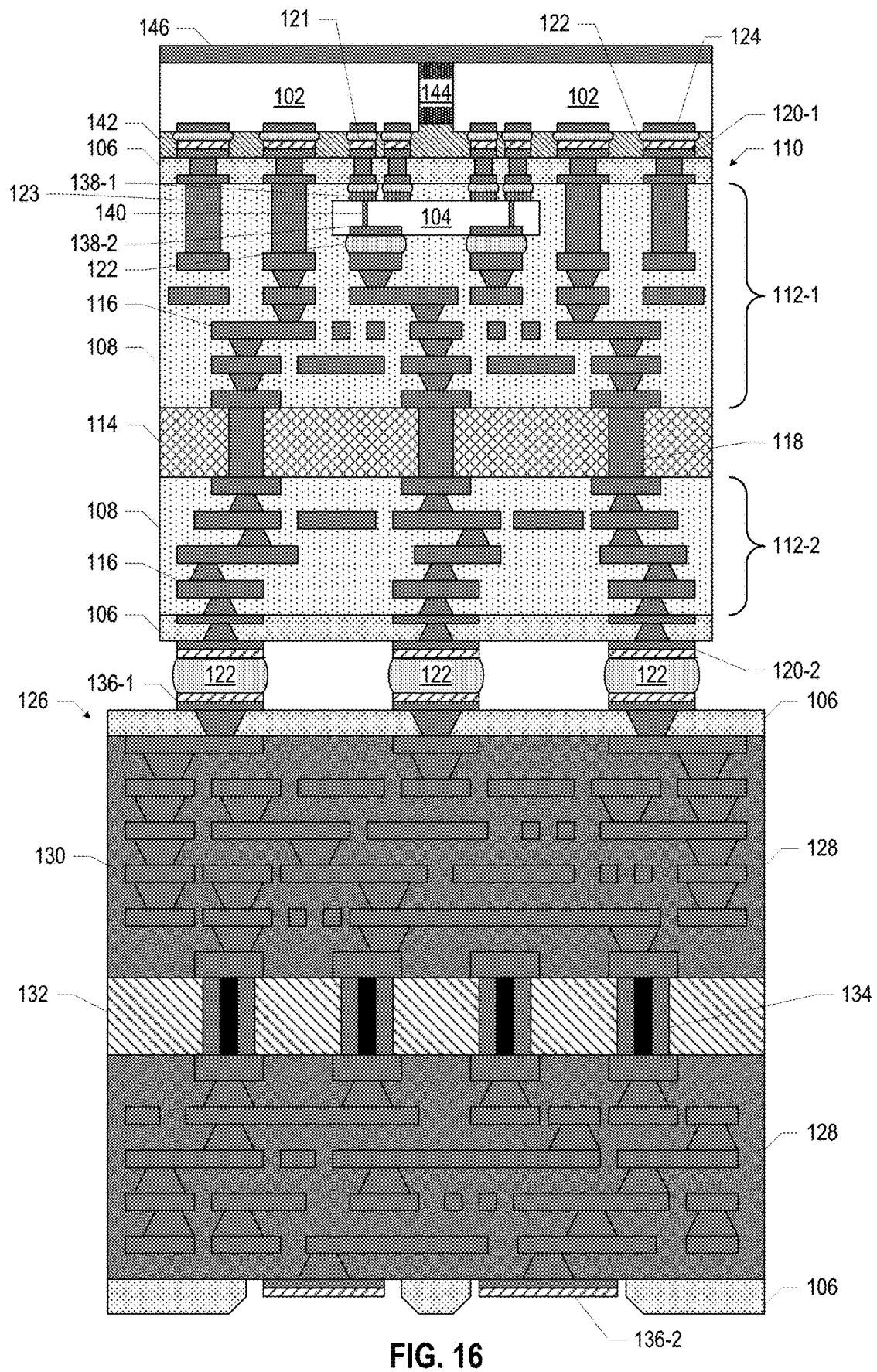

FIG. 16 illustrates an assembly subsequent to attaching the assembly of FIG. 15 to the package substrate 126 via intervening solder 122 (e.g., using a mass reflow or TCB operation). The package substrate 126 may be manufactured using conventional package substrate manufacturing techniques. The assembly of FIG. 16 may take the form of the microelectronic assembly 100 of FIG. 1.

Figure 17:
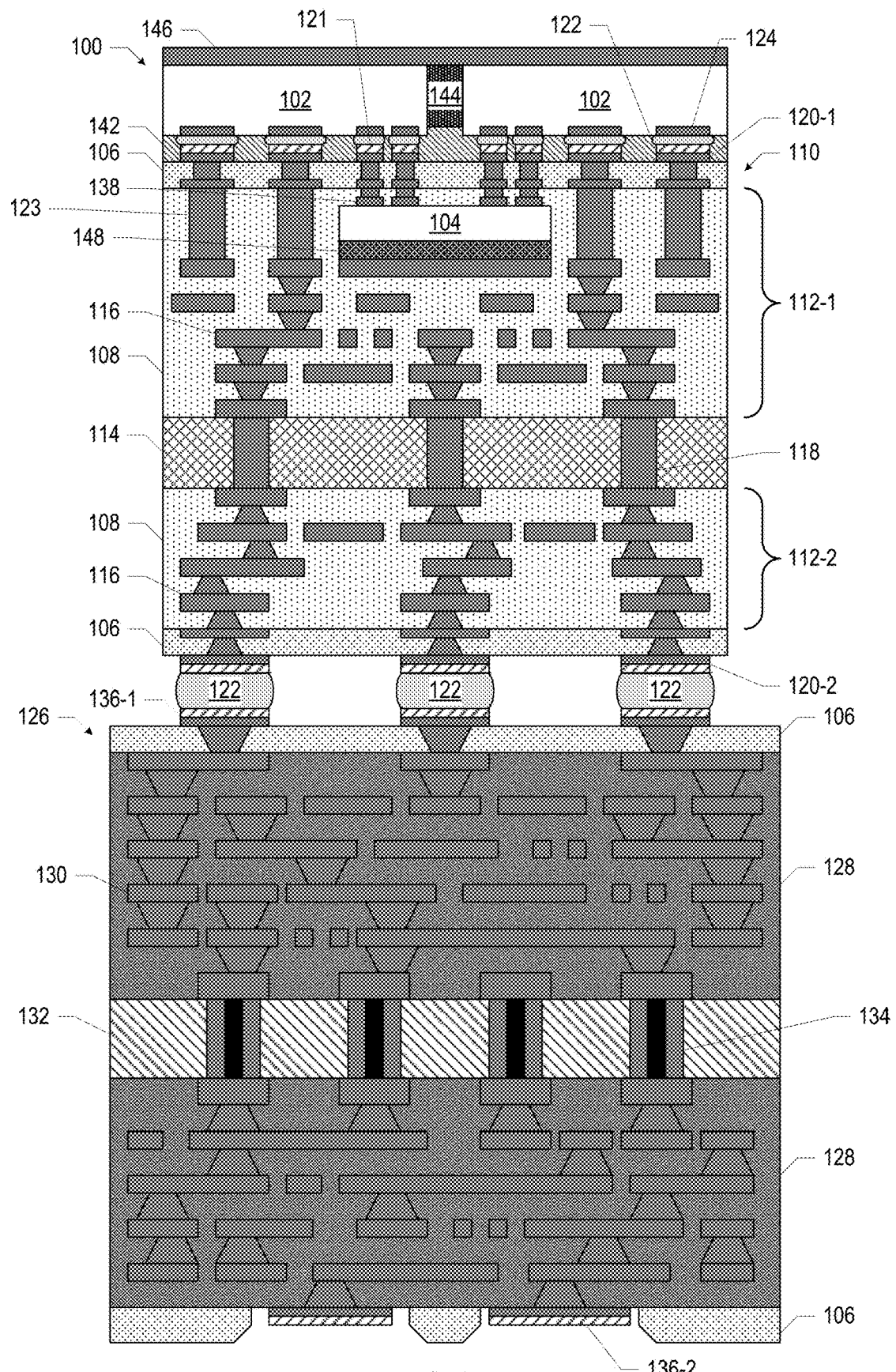
FIGS. 17 and 18 are side, cross-sectional views of other example microelectronic assemblies including a microelectronic structure having a glass core, in accordance with various embodiments.

As noted above, in some embodiments, the bridge component 104 may not include conductive contacts 138-2 at its "bottom" face. For example, FIG. 17 illustrates a microelectronic assembly 100 having many features in common with the microelectronic assembly 100 of FIG. 1, but in which the bridge component 104 only includes conductive contacts 138 at its "top" face, and in which the bridge component 104 is coupled to the metallization region 112-1 by an adhesive material 148. In some embodiments, such a bridge component 104 may not include any TSVs 140, as shown. The adhesive material 148 may include any suitable material, such as a die-attach film. In some embodiments, the thickness of the adhesive material 148 may be between 2 microns and 10 microns.

Figure 18:
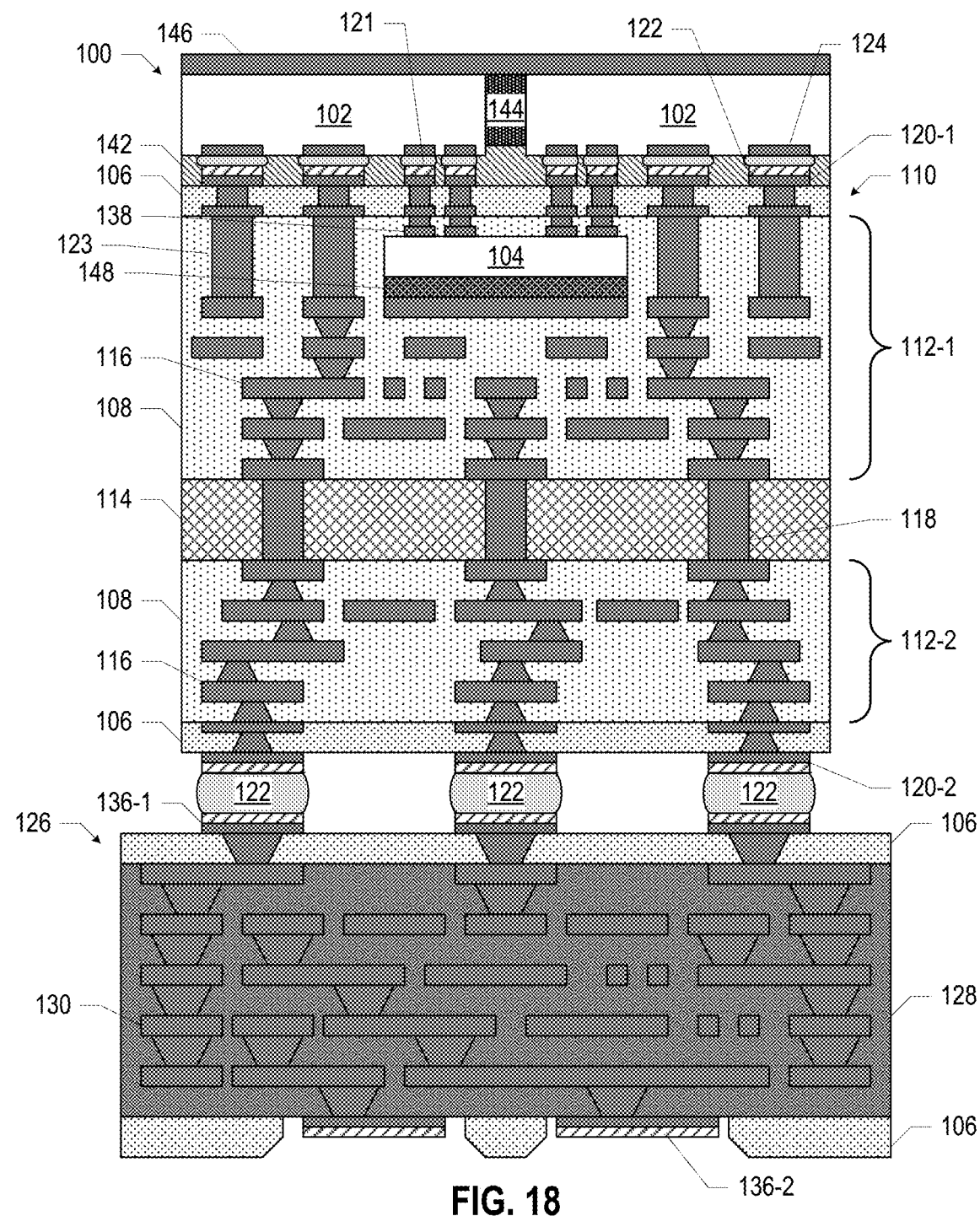

As noted above, in some embodiments, the package substrate 126 may be a coreless package substrate. FIG. 18 illustrates a microelectronic assembly 100 having many features in common with the microelectronic assembly 100 of FIG. 1, but in which the package substrate 126 does not include a core. Note that, in the microelectronic assembly of FIG. 18, the vias of the conductive material 130 of the package substrate 126 all taper in a common direction (in contrast to the vias of the conductive material 130 of the package substrate 126 of FIG. 1, in which the "top" and "bottom" vias taper in opposite directions towards the core 132).

The microelectronic structures 110 and microelectronic assemblies 100 disclosed herein may be included in any suitable electronic component. FIGS. 19-22 illustrate various examples of apparatuses that may include any of the microelectronic structures 110 and microelectronic assemblies 100 disclosed herein, or may be included in microelectronic structures 110 and microelectronic assemblies 100 disclosed herein, as appropriate.

Figure 19:
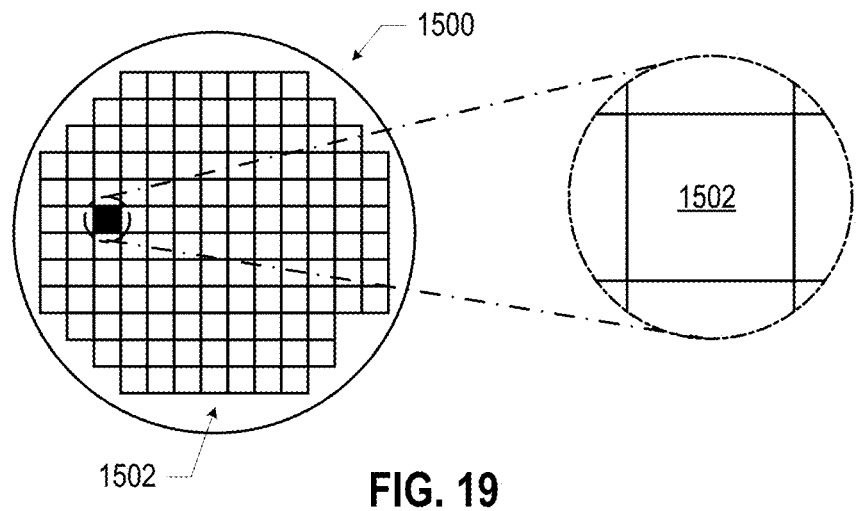
FIG. 19 is a top view of a wafer and dies that may be included in a microelectronic structure or microelectronic assembly in accordance with any of the embodiments disclosed herein.

FIG. 19 is a top view of a wafer 1500 and dies 1502 that may be included in any of the microelectronic structures 110 and microelectronic assemblies 100 disclosed herein. For example, a die 1502 may be included in a microelectronic structure 110/microelectronic assembly 100 as (or part of) a bridge component 104 and/or a die 102. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 20, discussed below), one or more diodes, and/or supporting circuitry to route electrical signals to the transistors, as well as any other IC components. In some embodiments, a die 1502 may be a "passive" die in that it includes no active components (e.g., transistors), while in other embodiments, a die 1502 may be an "active" die in that it includes active components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 22) or other logic that is configured to store information in the memory devices or execute instructions stored in the memory array.

Figure 20:
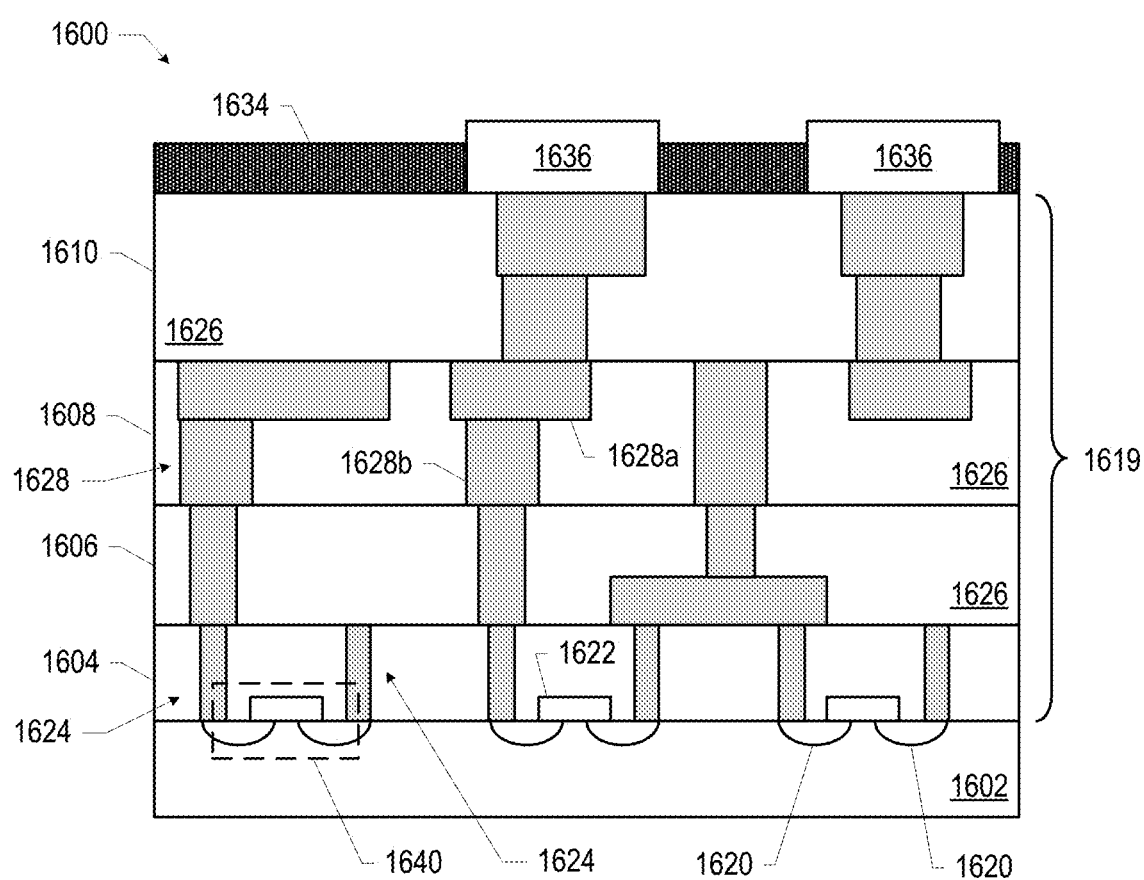
FIG. 20 is a side, cross-sectional view of an integrated circuit (IC) device that may include be included in a microelectronic structure or microelectronic assembly in accordance with any of the embodiments disclosed herein.

FIG. 20 is a side, cross-sectional view of an IC device 1600 that may be included in a microelectronic structure 110 and/or a microelectronic assembly 100. For example, an IC device 1600 may be included in a microelectronic structure 110/microelectronic assembly 100 as (or part of) a bridge component 104 and/or a die 102. An IC device 1600 may be part of a die 1502 (e.g., as discussed above with reference to FIG. 19). One or more of the IC devices 1600 may be included in one or more dies 1502 (FIG. 19). The IC device 1600 may be formed on a substrate 1602 (e.g., the wafer 1500 of FIG. 19) and may be included in a die (e.g., the die 1502 of FIG. 19). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 19) or a wafer (e.g., the wafer 1500 of FIG. 19).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 20 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 20 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, an IC device 1600 may be a "passive" device in that it includes no active components (e.g., transistors), while in other embodiments, a die 1502 may be an "active" die in that it includes active components.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 20). Although a particular number of interconnect layers 1606-1610 is depicted in FIG. 20, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 20. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 20. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a surface insulation material 1634 (e.g., polyimide or similar material) and one or more conductive contacts 1636 formed on the interconnect layers 1606-1610. In FIG. 20, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 21:
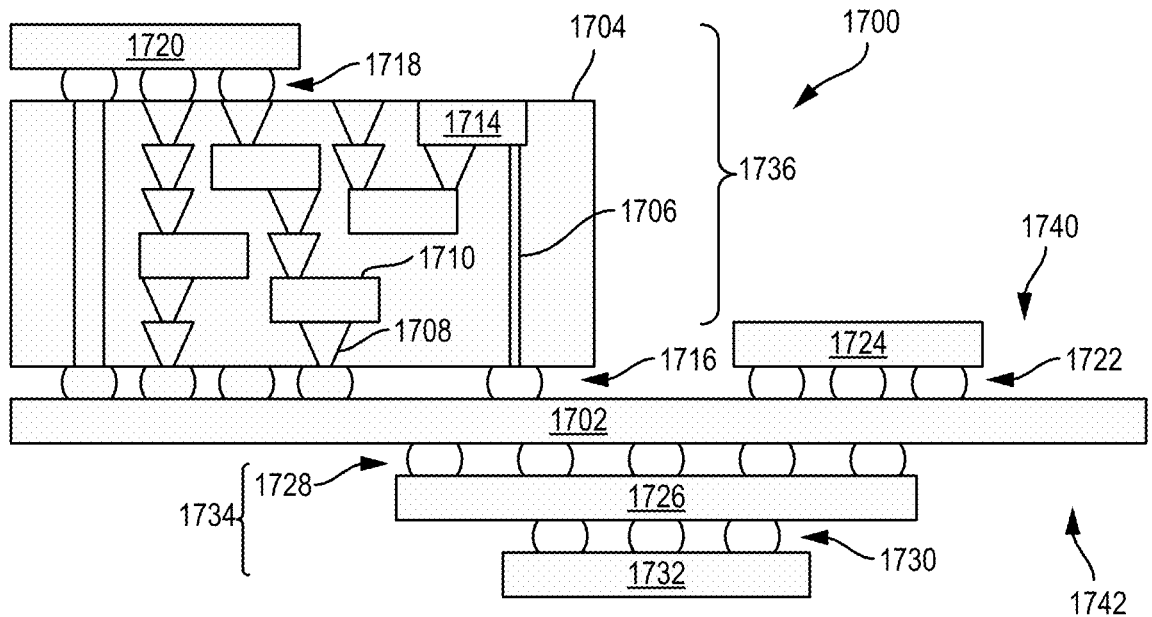
FIG. 21 is a side, cross-sectional view of an IC device assembly that may include a microelectronic structure or microelectronic assembly in accordance with any of the embodiments disclosed herein.

FIG. 21 is a side, cross-sectional view of an IC device assembly 1700 that may include one or more microelectronic structures 110 and/or microelectronic assemblies 100, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the microelectronic assemblies 100 discussed herein, or may otherwise include any of the microelectronic structures 110 disclosed herein.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 21 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 21), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 21, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 19), an IC device (e.g., the IC device 1600 of FIG. 20), or any other suitable component. Generally, the package interposer 1704 may spread a connection to a wider pitch or reroute a connection to a different connection. For example, the package interposer 1704 may couple the IC package 1720 (e.g., a die) to a set of ball grid array (BGA) conductive contacts of the coupling components 1716 for coupling to the circuit board 1702. In the embodiment illustrated in FIG. 21, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more microelectronic structures 110 and/or microelectronic assemblies 100.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 21 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 22:
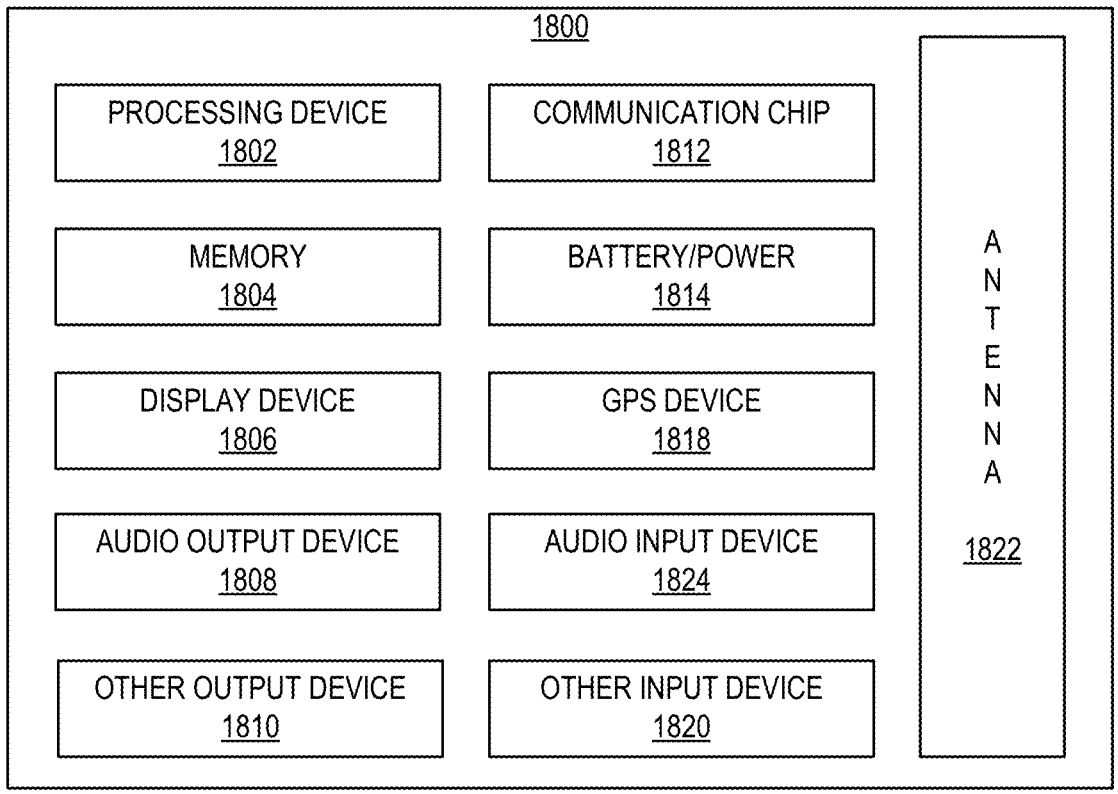
FIG. 22 is a block diagram of an example electrical device that may include a microelectronic structure or microelectronic assembly in accordance with any of the embodiments disclosed herein.

FIG. 22 is a block diagram of an example electrical device 1800 that may include one or more microelectronic structures 110 and/or microelectronic assemblies 100 in accordance with any of the embodiments disclosed herein. For example, any suitable ones of the components of the electrical device 1800 may include one or more of the microelectronic structures 110, microelectronic assemblies 100, IC device assemblies 1700, IC devices 1600, or dies 1502 disclosed herein. A number of components are illustrated in FIG. 22 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 22, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a microelectronic structure, including: a glass core having through-glass vias (TGVs) therein; a first metallization region at a first face of the glass core, wherein a first conductive pathway in the first metallization region is conductively coupled to at least one of the TGVs; a second metallization region at a second face of the glass core, wherein a second conductive pathway in the second metallization region is conductively coupled to at least one of the TGVs, and the second face of the glass core is opposite the first face of the glass core; a bridge component in the first metallization region; a first conductive contact at a face of the first metallization region, wherein the first conductive contact is conductively coupled to the first conductive pathway; and a second conductive contact at the face of the first metallization region, wherein the second conductive contact is conductively coupled to the bridge component.

Example 2 includes the subject matter of Example 1, and further specifies that the bridge component includes a transistor.

Example 3 includes the subject matter of Example 1, and further specifies that the bridge component does not include a transistor.

Example 4 includes the subject matter of any of Examples 1-3, and further specifies that the bridge component includes a first face and an opposing second face, the first face of the bridge component is between the second face of the bridge component and the face of the first metallization region, the bridge component includes a conductive contact at the first face of the bridge component, and the conductive contact of the bridge component is conductively coupled to the second conductive contact at the face of the first metallization region.

Example 5 includes the subject matter of Example 4, and further specifies that a first conductive pillar and a second conductive pillar are between the conductive contact of the bridge component and the second conductive contact at the face of the first metallization region, and the first conductive pillar is between the second conductive pillar and the conductive contact of the bridge component.

Example 6 includes the subject matter of any of Examples 4-5, and further specifies that the conductive contact at the first face of the bridge component is a first conductive contact at the first face of the bridge component, the bridge component includes a second conductive contact at the second face of the bridge component, and the second conductive contact at the second face of the bridge component is conductively coupled to a third conductive pathway in the first metallization region.

Example 7 includes the subject matter of Example 6, and further specifies that the third conductive pathway is conductively coupled to at least one of the TGVs.

Example 8 includes the subject matter of any of Examples 6-7, and further specifies that the second conductive contact is conductively coupled to the third conductive pathway by solder.

Example 9 includes the subject matter of Example 4, and further specifies that the bridge component does not include conductive contacts at the second face of the bridge component.

Example 10 includes the subject matter of Example 9, and further includes: adhesive in contact with the second face of the bridge component.

Example 11 includes the subject matter of any of Examples 1-10, and further specifies that the first metallization region includes conductive pillars.

Example 12 includes the subject matter of Example 11, and further specifies that a plane parallel to the face of the first metallization region extends through the conductive pillars and the bridge component.

Example 13 includes the subject matter of any of Examples 1-12, and further specifies that the first conductive contact at the face of the first metallization region is one of a plurality of first conductive contacts at the face of the first metallization region, the second conductive contact at the face of the first metallization region is one of a plurality of second conductive contacts at the face of the first metallization region, and a pitch of the first conductive contacts is less than a pitch of the second conductive contacts.

Example 14 includes the subject matter of Example 13, and further specifies that the pitch of the first conductive contacts is less than 36 microns.

Example 15 includes the subject matter of any of Examples 13-14, and further specifies that the pitch of the second conductive contacts is greater than 36 microns.

Example 16 includes the subject matter of any of Examples 1-15, and further specifies that the first metallization region includes four or fewer metallization layers.

Example 17 includes the subject matter of any of Examples 1-16, and further specifies that the second metallization region includes four or fewer metallization layers.

Example 18 includes the subject matter of any of Examples 1-17, and further specifies that a number of metallization layers in the first metallization region is the same as a number of metallization layers in the second metallization region.

Example 19 includes the subject matter of any of Examples 1-18, and further specifies that a number of metallization layers in the first metallization region is different than a number of metallization layers in the second metallization region.

Example 20 includes the subject matter of any of Examples 1-19, and further specifies that a thickness of the first metallization region is between 30 microns and 200 microns.

Example 21 includes the subject matter of any of Examples 1-20, and further specifies that a thickness of the second metallization region is between 30 microns and 200 microns.

Example 22 includes the subject matter of any of Examples 1-21, and further specifies that the glass core has a thickness between 350 microns and 500 microns.

Example 23 includes the subject matter of any of Examples 1-22, and further specifies that the glass core has a coefficient of thermal expansion that is less than 6 per degree Celsius.

Example 24 includes the subject matter of any of Examples 1-23, and further specifies that a pitch of the TGVs is between 75 microns and 200 microns.

Example 25 includes the subject matter of any of Examples 1-24, and further specifies that a pitch of the TGVs is between 75 microns and 150 microns.

Example 26 includes the subject matter of any of Examples 1-25, and further specifies that a diameter of the TGVs is between 35 microns and 100 microns.

Example 27 includes the subject matter of any of Examples 1-26, and further specifies that a diameter of the TGVs is between 35 microns and 75 microns.

Example 28 is a microelectronic assembly, including: a first die; a second die; a microelectronic structure, wherein the microelectronic structure includes a glass core, a first metallization region at a first face of the glass core, and a second metallization region at an opposing second face of the glass core, and wherein the first die and the second die are coupled to a face of the first metallization region; and a package substrate, wherein the package substrate is coupled to a face of the second metallization region.

Example 29 includes the subject matter of Example 28, and further specifies that the package substrate includes an organic dielectric material.

Example 30 includes the subject matter of any of Examples 28-29, and further specifies that the package substrate includes a core.

Example 31 includes the subject matter of any of Examples 28-29, and further specifies that the package substrate does not include a core.

Example 32 includes the subject matter of any of Examples 28-31, and further specifies that the microelectronic structure is coupled to the package substrate by solder between the package substrate and the second metallization region.

Example 33 includes the subject matter of any of Examples 28-32, and further specifies that the die is coupled to the face of the first metallization region by solder.

Example 34 includes the subject matter of any of Examples 28-33, and further includes: a mold compound between the first die and the second die.

Example 35 includes the subject matter of any of Examples 28-34, and further includes: an underfill material between the first die and the microelectronic structure.

Example 36 includes the subject matter of any of Examples 28-35, and further specifies that the microelectronic structure includes a bridge component in the first metallization region, the first die partially overlaps the bridge component, and the second die partially overlaps the bridge component.

Example 37 includes the subject matter of Example 36, and further specifies that the bridge component includes a transistor.

Example 38 includes the subject matter of Example 36, and further specifies that the bridge component does not include a transistor.

Example 39 includes the subject matter of any of Examples 36-38, and further specifies that the glass core includes through-glass vias (TGVs) therein, and the microelectronic structure further includes: a first conductive contact at the face of the first metallization region; and a second conductive contact at the face of the first metallization region; wherein a first conductive pathway in the first metallization region is conductively coupled to at least one of the TGVs, a second conductive pathway in the second metallization region is conductively coupled to at least one of the TGVs, the second face of the glass core is opposite the first face of the glass core, the first conductive contact is conductively coupled to the first conductive pathway, and the second conductive contact is conductively coupled to the bridge component.

Example 40 includes the subject matter of Example 39, and further specifies that a pitch of the TGVs is between 75 microns and 200 microns.

Example 41 includes the subject matter of any of Examples 39-40, and further specifies that a pitch of the TGVs is between 75 microns and 150 microns.

Example 42 includes the subject matter of any of Examples 39-41, and further specifies that a diameter of the TGVs is between 35 microns and 100 microns.

Example 43 includes the subject matter of any of Examples 39-42, and further specifies that a diameter of the TGVs is between 35 microns and 75 microns.

Example 44 includes the subject matter of any of Examples 39-43, and further specifies that the bridge component includes a first face and an opposing second face, the first face of the bridge component is between the second face of the bridge component and the face of the first metallization region, the bridge component includes a conductive contact at the first face of the bridge component, and the conductive contact of the bridge component is conductively coupled to the second conductive contact at the face of the first metallization region.

Example 45 includes the subject matter of Example 44, and further specifies that a first conductive pillar and a second conductive pillar are between the conductive contact of the bridge component and the second conductive contact at the face of the first metallization region, and the first conductive pillar is between the second conductive pillar and the conductive contact of the bridge component.

Example 46 includes the subject matter of any of Examples 44-45, and further specifies that the conductive contact at the first face of the bridge component is a first conductive contact at the first face of the bridge component, the bridge component includes a second conductive contact at the second face of the bridge component, and the second conductive contact at the second face of the bridge component is conductively coupled to a third conductive pathway in the first metallization region.

Example 47 includes the subject matter of Example 46, and further specifies that the third conductive pathway is conductively coupled to at least one of the TGVs.

Example 48 includes the subject matter of any of Examples 46-47, and further specifies that the second conductive contact is conductively coupled to the third conductive pathway by solder.

Example 49 includes the subject matter of Example 44, and further specifies that the bridge component does not include conductive contacts at the second face of the bridge component.

Example 50 includes the subject matter of Example 49, and further includes: adhesive in contact with the second face of the bridge component.

Example 51 includes the subject matter of any of Examples 39-50, and further specifies that the first conductive contact at the face of the first metallization region is one of a plurality of first conductive contacts at the face of the first metallization region, the second conductive contact at the face of the first metallization region is one of a plurality of second conductive contacts at the face of the first metallization region, and a pitch of the first conductive contacts is less than a pitch of the second conductive contacts.

Example 52 includes the subject matter of Example 51, and further specifies that the pitch of the first conductive contacts is less than 36 microns.

Example 53 includes the subject matter of any of Examples 51-52, and further specifies that the pitch of the second conductive contacts is greater than 36 microns.

Example 54 includes the subject matter of any of Examples 28-54, and further specifies that the first metallization region includes conductive pillars.

Example 55 includes the subject matter of Example 54, and further specifies that the microelectronic structure includes a bridge component in the first metallization region, and a plane parallel to the face of the first metallization region extends through the conductive pillars and the bridge component.

Example 56 includes the subject matter of any of Examples 28-55, and further specifies that the first metallization region includes four or fewer metallization layers.

Example 57 includes the subject matter of any of Examples 28-56, and further specifies that the second metallization region includes four or fewer metallization layers.

Example 58 includes the subject matter of any of Examples 28-57, and further specifies that a number of metallization layers in the first metallization region is the same as a number of metallization layers in the second metallization region.

Example 59 includes the subject matter of any of Examples 28-58, and further specifies that a number of metallization layers in the first metallization region is different than a number of metallization layers in the second metallization region.

Example 60 includes the subject matter of any of Examples 28-59, and further specifies that a thickness of the first metallization region is between 30 microns and 200 microns.

Example 61 includes the subject matter of any of Examples 28-60, and further specifies that a thickness of the second metallization region is between 30 microns and 200 microns.

Example 62 includes the subject matter of any of Examples 28-61, and further specifies that the glass core has a thickness between 350 microns and 500 microns.

Example 63 includes the subject matter of any of Examples 28-62, and further specifies that the glass core has a coefficient of thermal expansion that is less than 6 per degree Celsius.

Example 64 includes the subject matter of any of Examples 28-63, and further specifies that a number of metallization layers of the package substrate is between 10 and 25.

Example 65 is a microelectronic assembly, including: a first die; a second die; a microelectronic structure, wherein the microelectronic structure includes a glass core, a metallization region at a face of the glass core, and a bridge component in the metallization region, and wherein the first die and the second die are coupled to a face of the metallization region; and a package substrate, wherein the microelectronic structure is coupled between the package substrate and the dies, and the glass core is between the package substrate and the bridge component.

Example 66 includes the subject matter of Example 65, and further specifies that the package substrate includes an organic dielectric material.

Example 67 includes the subject matter of any of Examples 65-66, and further specifies that the package substrate includes a core.

Example 68 includes the subject matter of any of Examples 65-66, and further specifies that the package substrate does not include a core.

Example 69 includes the subject matter of any of Examples 65-68, and further specifies that the metallization region is a first metallization region, the face of the glass core is a first face of the glass core, and the microelectronic structure includes a second metallization region at an opposing second face of the glass core.

Example 70 includes the subject matter of Example 69, and further specifies that the second metallization region includes four or fewer metallization layers.

Example 71 includes the subject matter of any of Examples 69-70, and further specifies that a number of metallization layers in the first metallization region is the same as a number of metallization layers in the second metallization region.

Example 72 includes the subject matter of any of Examples 69-71, and further specifies that a number of metallization layers in the first metallization region is different than a number of metallization layers in the second metallization region.

Example 73 includes the subject matter of any of Examples 69-72, and further specifies that a thickness of the second metallization region is between 30 microns and 200 microns.

Example 74 includes the subject matter of any of Examples 69-73, and further specifies that the microelectronic structure is coupled to the package substrate by solder between the package substrate and the second metallization region.

Example 75 includes the subject matter of any of Examples 65-74, and further specifies that the metallization region includes four or fewer metallization layers.

Example 76 includes the subject matter of any of Examples 65-75, and further specifies that a thickness of the metallization region is between 30 microns and 200 microns.

Example 77 includes the subject matter of any of Examples 65-76, and further specifies that the die is coupled to the face of the metallization region by solder.

Example 78 includes the subject matter of any of Examples 65-77, and further includes: a mold compound between the first die and the second die.

Example 79 includes the subject matter of any of Examples 65-78, and further includes: an underfill material between the first die and the microelectronic structure.

Example 80 includes the subject matter of any of Examples 65-79, and further specifies that the first die partially overlaps the bridge component, and the second die partially overlaps the bridge component.

Example 81 includes the subject matter of any of Examples 65-80, and further specifies that the bridge component includes a transistor.

Example 82 includes the subject matter of any of Examples 65-80, and further specifies that the bridge component does not include a transistor.

Example 83 includes the subject matter of any of Examples 65-83, and further specifies that the glass core includes through-glass vias (TGVs) therein, and the microelectronic structure further includes: a first conductive contact at the face of the metallization region; and a second conductive contact at the face of the metallization region; wherein a first conductive pathway in the metallization region is conductively coupled to at least one of the TGVs, the first conductive contact is conductively coupled to the first conductive pathway, and the second conductive contact is conductively coupled to the bridge component.

Example 84 includes the subject matter of Example 83, and further specifies that a pitch of the TGVs is between 75 microns and 200 microns.

Example 85 includes the subject matter of any of Examples 83-84, and further specifies that a pitch of the TGVs is between 75 microns and 150 microns.

Example 86 includes the subject matter of any of Examples 83-85, and further specifies that a diameter of the TGVs is between 35 microns and 100 microns.

Example 87 includes the subject matter of any of Examples 83-86, and further specifies that a diameter of the TGVs is between 35 microns and 75 microns.

Example 88 includes the subject matter of any of Examples 83-87, and further specifies that the bridge component includes a first face and an opposing second face, the first face of the bridge component is between the second face of the bridge component and the face of the metallization region, the bridge component includes a conductive contact at the first face of the bridge component, and the conductive contact of the bridge component is conductively coupled to the second conductive contact at the face of the metallization region.

Example 89 includes the subject matter of Example 88, and further specifies that a first conductive pillar and a second conductive pillar are between the conductive contact of the bridge component and the second conductive contact at the face of the metallization region, and the first conductive pillar is between the second conductive pillar and the conductive contact of the bridge component.

Example 90 includes the subject matter of any of Examples 88-89, and further specifies that the conductive contact at the first face of the bridge component is a first conductive contact at the first face of the bridge component, the bridge component includes a second conductive contact at the second face of the bridge component, and the second conductive contact at the second face of the bridge component is conductively coupled to a third conductive pathway in the metallization region.

Example 91 includes the subject matter of Example 90, and further specifies that the third conductive pathway is conductively coupled to at least one of the TGVs.

Example 92 includes the subject matter of any of Examples 90-91, and further specifies that the second conductive contact is conductively coupled to the third conductive pathway by solder.

Example 93 includes the subject matter of Example 88, and further specifies that the bridge component does not include conductive contacts at the second face of the bridge component.

Example 94 includes the subject matter of Example 88, and further includes: adhesive in contact with the second face of the bridge component.

Example 95 includes the subject matter of any of Examples 83-94, and further specifies that the first conductive contact at the face of the metallization region is one of a plurality of first conductive contacts at the face of the metallization region, the second conductive contact at the face of the metallization region is one of a plurality of second conductive contacts at the face of the metallization region, and a pitch of the first conductive contacts is less than a pitch of the second conductive contacts.

Example 96 includes the subject matter of Example 95, and further specifies that the pitch of the first conductive contacts is less than 36 microns.

Example 97 includes the subject matter of any of Examples 95-96, and further specifies that the pitch of the second conductive contacts is greater than 36 microns.

Example 98 includes the subject matter of any of Examples 65-97, and further specifies that the metallization region includes conductive pillars.

Example 99 includes the subject matter of Example 98, and further specifies that a plane parallel to the face of the metallization region extends through the conductive pillars and the bridge component.

Example 100 includes the subject matter of any of Examples 65-99, and further specifies that the glass core has a thickness between 350 microns and 500 microns.

Example 101 includes the subject matter of any of Examples 65-100, and further specifies that the glass core has a coefficient of thermal expansion that is less than 6 per degree Celsius.

Example 102 includes the subject matter of any of Examples 65-101, and further specifies that a number of metallization layers of the package substrate is between 10 and 25.

Example 103 is an electronic device, including: a circuit board; and a microelectronic assembly conductively coupled to the circuit board, wherein the microelectronic assembly includes the microelectronic assemblies or structures of any of Examples 1-102.

Example 104 includes the subject matter of Example 103, and further specifies that the electronic device is a handheld computing device, a laptop computing device, a wearable computing device, or a server computing device.

Example 105 includes the subject matter of any of Examples 103-104, and further specifies that the circuit board is a motherboard.

Example 106 includes the subject matter of any of Examples 103-105, and further includes: a display communicatively coupled to the circuit board.

Example 107 includes the subject matter of Example 106, and further specifies that the display includes a touchscreen display.

Example 108 includes the subject matter of any of Examples 103-107, and further includes: a housing around the circuit board and the microelectronic assembly.

Example 109 is a method of manufacturing a microelectronic structure, including any of the methods disclosed herein.

Example 110 is a method of manufacturing a microelectronic assembly, including any of the methods disclosed herein.

The invention claimed is:

1. A microelectronic structure, comprising:
   a glass core having through-glass vias (TGVs) therein;
   a first metallization region at a first face of the glass core, wherein a first conductive pathway in the first metallization region is conductively coupled to at least one of the TGVs;
   a second metallization region at a second face of the glass core, wherein a second conductive pathway in the second metallization region is conductively coupled to at least one of the TGVs, and the second face of the glass core is opposite the first face of the glass core;
   a bridge component in the first metallization region;
   a first conductive contact at a face of the first metallization region, wherein the first conductive contact is conductively coupled to the first conductive pathway, and wherein the face of the first metallization region is opposite the glass core; and
   a second conductive contact at the face of the first metallization region, wherein the second conductive contact is conductively coupled to the bridge component, wherein:
      the bridge component includes a first face and an opposing second face, the first face of the bridge component is between the second face of the bridge component and the face of the first metallization region, the bridge component includes a conductive contact at the first face of the bridge component, the conductive contact at the first face of the bridge component is conductively coupled to the second conductive contact at the face of the first metallization region, a first conductive pillar is directly connected to the conductive contact of the bridge component, a second conductive pillar is directly connected to an interstitial conductive contact directly connected to the first conductive pillar, the second conductive pillar is directly connected to the second conductive contact at the face of the first metallization region, and the first conductive pillar, the interstitial conductive contact, and the second conductive pillar are physically between the first face of the bridge component and the face of the first metallization region.

2. The microelectronic structure of claim 1, wherein the conductive contact at the first face of the bridge component is a first conductive contact at the first face of the bridge component, the bridge component includes a second conductive contact at the second face of the bridge component, and the second conductive contact at the second face of the bridge component is conductively coupled to a third conductive pathway in the first metallization region.

3. The microelectronic structure of claim 2, wherein the third conductive pathway is conductively coupled to at least one of the TGVs.

4. The microelectronic structure of claim 2, wherein the second conductive contact at the second face of the bridge component is conductively coupled to the third conductive pathway by solder.

5. The microelectronic structure of claim 1, wherein the first metallization region includes conductive pillars.

6. The microelectronic structure of claim 5, wherein a plane parallel to the face of the first metallization region extends through the conductive pillars and the bridge component.

* * * * *